(12) United States Patent
Jung

(10) Patent No.: US 7,898,025 B2
(45) Date of Patent: Mar. 1, 2011

(54) SEMICONDUCTOR DEVICE HAVING RECESS GATE

(75) Inventor: Young-Kyun Jung, Kyoungki-do (KR)

(73) Assignee: Hynix Semiconductor Inc., Ichon-Shi, Kyoungki-do (KR)

(*) Notice: Subject to any disclaimer, the term of this patent is extended or adjusted under 35 U.S.C. 154(b) by 0 days.

(21) Appl. No.: 12/553,581

(22) Filed: Sep. 3, 2009

(65) Prior Publication Data

US 2009/0321821 A1 Dec. 31, 2009

Related U.S. Application Data

(62) Division of application No. 11/646,233, filed on Dec. 28, 2006, now abandoned.

(30) Foreign Application Priority Data

Jun. 30, 2006 (KR) .................. 10-2006-0060292
Dec. 8, 2006 (KR) .................. 10-2006-0124735

(51) Int. Cl.
*H01L 29/94* (2006.01)

(52) U.S. Cl. ......... 257/330; 257/283; 257/284; 257/332; 257/333; 257/E29.2; 257/E21.429

(58) Field of Classification Search ............... 257/283, 257/284, 330, 332, 333, E29.2, E21.429; 438/259, 270
See application file for complete search history.

(56) References Cited

U.S. PATENT DOCUMENTS

| | | | |
|---|---|---|---|
| 6,667,227 B1 | 12/2003 | Liu et al. | |
| 6,677,205 B2 | 1/2004 | Beintner | |
| 2004/0124461 A1 | 7/2004 | Gajda | |
| 2005/0001266 A1 | 1/2005 | Kim | |
| 2005/0020086 A1 | 1/2005 | Kim et al. | |
| 2006/0006410 A1 | 1/2006 | Lee et al. | |

FOREIGN PATENT DOCUMENTS

| | | |
|---|---|---|
| CN | 1794467 | 6/2006 |
| KR | 1999-000763 | 1/1999 |
| KR | 1020050119244 | 12/2005 |
| TW | 441022 | 6/2001 |
| TW | 495859 | 7/2002 |
| TW | 536746 | 6/2003 |

OTHER PUBLICATIONS

Notice of Allowance for Korean Application 10-2006-0124735.
Chinese Office Action for corresponding Chinese patent application 200710096999.4.
Office Action together with Search Report dated Oct. 27, 2009, for Taiwanese application No. 95149448, citing the above references.
Chinese Patent Certificate and Publication of application No. 200710096999.4, citing the above refernce(s).

*Primary Examiner* — Thanh V Pham
(74) *Attorney, Agent, or Firm* — Lowe Hauptman Ham & Berner LLP

(57) ABSTRACT

A semiconductor device having a recess gate includes a semiconductor substrate having a recess, a conductive pattern for a gate electrode filled into the recess, and having an extension portion protruding higher than a surface of the semiconductor substrate, an epitaxial semiconductor layer having a top surface disposed over the semiconductor substrate, and a gate insulating layer disposed between the epitaxial semiconductor layer and the conductive pattern, and between the semiconductor substrate and the conductive pattern. Further, a method of fabricating the same is disclosed.

7 Claims, 4 Drawing Sheets

SEMICONDUCTOR DEVICE HAVING RECESS GATE

CROSS REFERENCE TO RELATED APPLICATION

This application is a divisional of U.S. Ser. No. 11/646,233, filed on Dec. 28, 2006 now abandoned. This application, in its entirety, is incorporated herein by reference. The present invention claims priority of Korean patent application numbers KR 10-2006-0060292 and KR 10-2006-0124735, filed on Jun. 30, 2006 and Dec. 8, 2006, respectively, being incorporated by reference in their entirety.

BACKGROUND

The present invention relates to a semiconductor device, and more particularly, to a semiconductor device having a recess gate and a method of fabricating the same.

Recently, with the high integration of semiconductor memory devices, the devices shrink in size and patterns become fine. As the size of the device becomes smaller, a gate channel length is also reduced so that an operational speed or input/output rate of information becomes slower due to a leakage current caused by short channel effect, hot carrier effect and so on.

To prevent this phenomenon, there has been proposed various structured recess gates for securing a channel length. Among them, a bulb recess gate, which has been put to practical use in recent years, and is being actively researched because it has an advantage of securing the channel length effectively. The bulb recess gate is configured with an upper portion with a vertical shape and a lower portion with a bulb shape.

FIG. 1 illustrates a cross-sectional view showing a typical method of fabricating a recess gate in a semiconductor device. A device isolation structure 12 is formed in a predetermined region of a semiconductor substrate 11 to define an active region and a field region. The semiconductor substrate 11 of the active region is selectively etched to form a bulb recess 13. The bulb recess 13 has an upper vertical portion 13A and a lower bulb shaped portion 13B. A gate insulating layer 14 is formed on the semiconductor substrate 11 where the bulb recess 13 is formed. A gate conductive layer is formed on the gate insulating layer 14 such that it is filled into the bulb recess 13 and protrudes higher than the top surface of the semiconductor substrate 11. Herein, the gate conductive layer comprises a polysilicon layer 15 and a metal or metal silicide layer 16, which are stacked in sequence.

As described above, the bulb recess gate is used for widening the channel length. However, since the upper vertical portion 13A of the bulb recess 13 is narrow but the lower bulb shaped portion 13B is rounded, the polysilicon layer 15 is not completely filled into the bulb shaped portion 13B so that a seam A occurs in the polysilicon layer 15.

In addition, the lower bulb shaped portion 13B of the bulb recess 13 is formed using an isotropic etch process, which leads to another limitation that there are sharp portions B where the upper vertical portion 13A and the bulb shaped portion 13B meet together. This sharp portion B has an adverse effect on device characteristics, e.g., deterioration of the gate insulating layer 14.

FIG. 2 illustrates a transmission electron microscope (TEM) micrograph showing the limitations according to the typical method. A polysilicon layer may not be completely filled into a recess and thus a seam occurs in the polysilicon layer.

SUMMARY OF THE INVENTION

Embodiments of the disclosure are directed to provide a semiconductor device having a recess gate and a method of fabricating the same, which can prevent the occurrence of a seam in depositing a conductive pattern for a gate electrode at least partially due to a shallow recess, and also can secure a sufficient channel length required for a high integrated device in spite of the shallow recess by using an epitaxial semiconductor layer.

In accordance with an some aspects of the disclosure, there is provided a semiconductor device having a recess gate, including: a semiconductor substrate having a recess; a conductive pattern for a gate electrode filled into the recess, and having an extension portion protruding higher than a surface of the semiconductor substrate; an epitaxial semiconductor layer having a top surface and disposed over the semiconductor substrate; and a gate insulating layer disposed between the epitaxial semiconductor layer and the conductive pattern, and between the semiconductor substrate and the conductive pattern.

In accordance with other embodiments, there is provided a method of fabricating a semiconductor device having a recess gate, the method comprising: forming a recess in a semiconductor substrate, wherein the semiconductor substrate has a top surface; forming a first gate insulating layer on a surface of the recess; forming a conductive pattern for a gate electrode, wherein the conductive pattern fills the recess, and has an extension portion protruding higher than the top surface of the semiconductor substrate; forming a second gate insulating layer on side surfaces of the extension portion of the conductive pattern; and epitaxially growing a semiconductor layer over the semiconductor substrate to a top surface of the conductive pattern.

In accordance with other embodiments, there is provided a method of fabricating a semiconductor device having a recess gate, the method comprising: forming a recess in a semiconductor substrate, wherein the semiconductor substrate has a top surface; forming a first gate insulating layer on a surface of the recess; and forming a conductive pattern for a gate electrode, wherein the conductive pattern fills the recess, and has an extension portion protruding higher than the top surface of the semiconductor substrate.

In accordance with other embodiments, there is provided a semiconductor device having a recess gate, comprising: a semiconductor substrate having a recess; and a conductive pattern for a gate electrode filled into the recess, and having an extension portion protruding higher than a surface of the semiconductor substrate.

DETAILED DESCRIPTION

Figure 1:
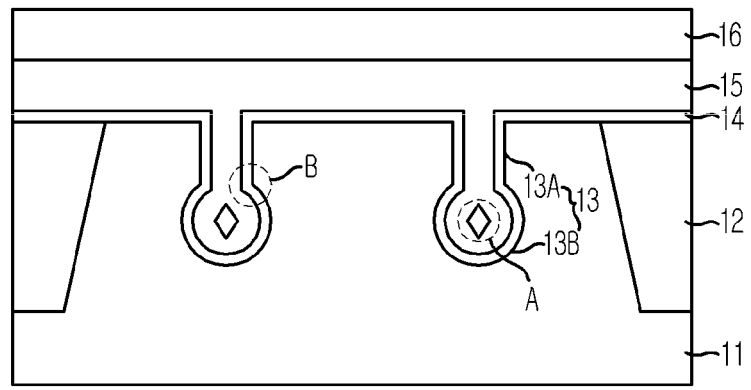
FIG. 1 illustrates a cross-sectional view showing a typical method of fabricating a recess gate in a semiconductor device.
Figure 2:
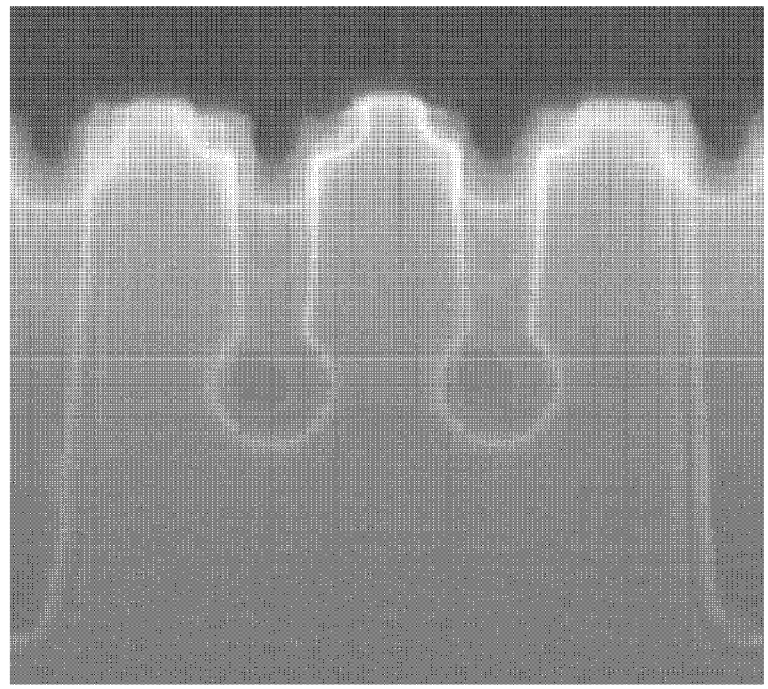
FIG. 2 illustrates a transmission electron microscope (TEM) micrograph showing limitations according to the typical method.
Figure 3:
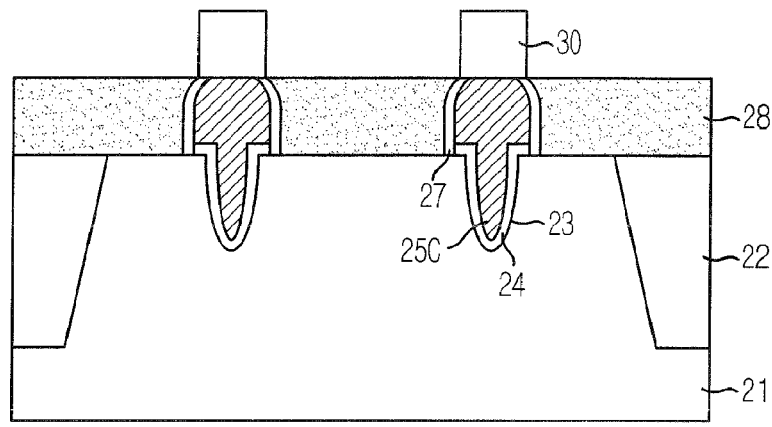
FIG. 3 illustrates a cross-sectional view of a recess gate structure of a semiconductor device in accordance with some embodiments of the disclosure.

FIG. 3 illustrates a cross-sectional view of a recess gate structure of a semiconductor device in accordance with some embodiments. A device isolation structure 22 is disposed in a semiconductor substrate 21 to define an active region. A recess 23 is formed in a semiconductor substrate 21. A gate electrode conductive pattern 25C is disposed over the semiconductor substrate 21 such that it fills the recess 23, wherein the gate electrode conductive pattern 25C has an extension portion that protrudes higher than the surface of the semiconductor substrate 21. An epitaxial semiconductor layer 28 is disposed over the resultant structure including the gate electrode conductive pattern 25C such that its top surface is as high as the top surface of the gate electrode conductive pattern 25C. The epitaxial semiconductor layer 28 is formed to a thickness of at least approximately 100 Å. A gate insulating layer is formed between the epitaxial semiconductor layer 28 and the gate electrode conductive pattern 25C, and between the semiconductor substrate 21 and the gate electrode conductive pattern 25C. More specifically, the gate insulating layer is configured with a first oxide layer 24 disposed between the semiconductor substrate 21 and the gate electrode conductive pattern 25C, and a second oxide layer 27 disposed between the epitaxial layer 28 and the gate electrode conductive pattern 25C.

Preferably, each of the semiconductor substrate 21 and the epitaxial semiconductor layer 28 may be formed of silicon, and the gate electrode conductive pattern 25C may be formed of polysilicon. In addition, a metal or metal silicide 30 for a gate electrode may be additionally disposed on the gate electrode conductive pattern 25C. For example, the metal or metal silicide 30 may include a tungsten layer or a tungsten silicide layer.

As described above, the recess gate structure in accordance with some embodiments has a shallower recess than that of the typical recess gate structure. Accordingly, there is no defect such as a seam when depositing the conductive pattern into the recess. Furthermore, some embodiments make use of the epitaxial semiconductor layer for securing the channel length. Thus, the epitaxial semiconductor layer 28 adjacent to the gate electrode conductive pattern 25C is provided for a channel.

FIGS. 4A to 4F illustrate cross-sectional views showing a method of fabricating a recess gate shown in FIG. 3 in accordance with some embodiments.

Figure 4A:
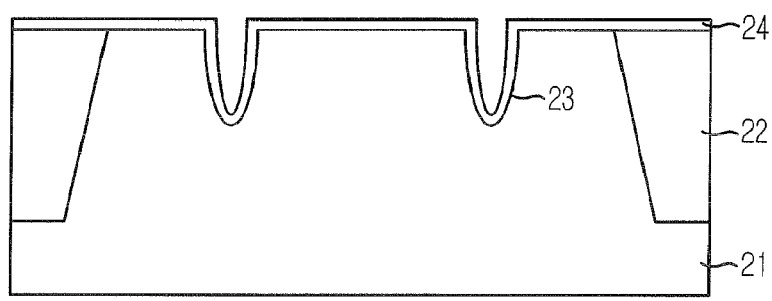
FIGS. 4A to 4F illustrate cross-sectional views showing a method of fabricating a recess gate in a semiconductor device in accordance with some embodiments of the disclosure.

Referring to FIG. 4A, a device isolation structure 22 is formed in a predetermined region of a semiconductor substrate 21 such as a silicon substrate using a shallow trench isolation (STI) process. The device isolation structure 22 defines an active region where transistors will be formed. Subsequently, a recess 23 is formed in the semiconductor substrate 21 using a typical recess mask and etching process. In some embodiments, the recess 23 may be formed as a circle type recess, and a line width may be at least 35 nm or greater. In addition, an amorphous carbon may be used as a hard mask in the recess mask and etching process. Thereafter, a first gate insulating layer 24 is formed along the surface of the semiconductor substrate 21 where the recess 23 is formed. The first gate insulating layer 24 may be formed of an oxide using thermal oxidation, dry oxidation or wet oxidation, and it may have a thickness of approximately 100 Å.

Figure 4B:
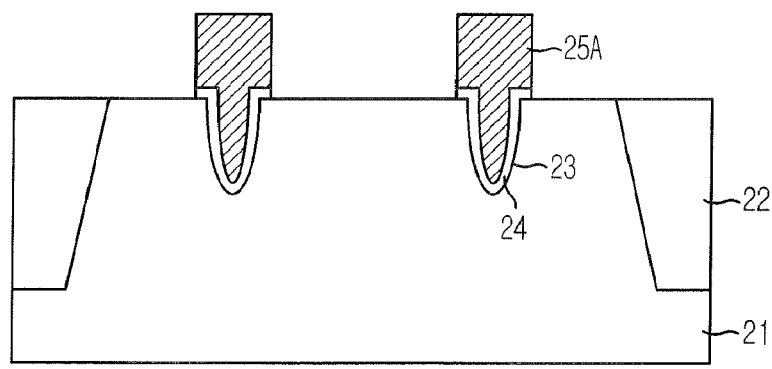

Referring to FIG. 4B, a conductive layer such as a polysilicon layer is deposited on the first gate insulating layer 24, and thereafter a gate mask and etching process is performed to form an angular conductive pattern 25A of which top corners are angular and sharp. In this case, a defect such as a seam does not occur when depositing the polysilicon layer because the depth of the recess 23 is shallow. The gate mask and etching process may be performed using a typical photolithography process using exposure light such as KrF or ArF excimer laser on condition that the line width of the mask is at least 25 nm or greater and its thickness is at least 20 Å or greater.

Figure 4C:
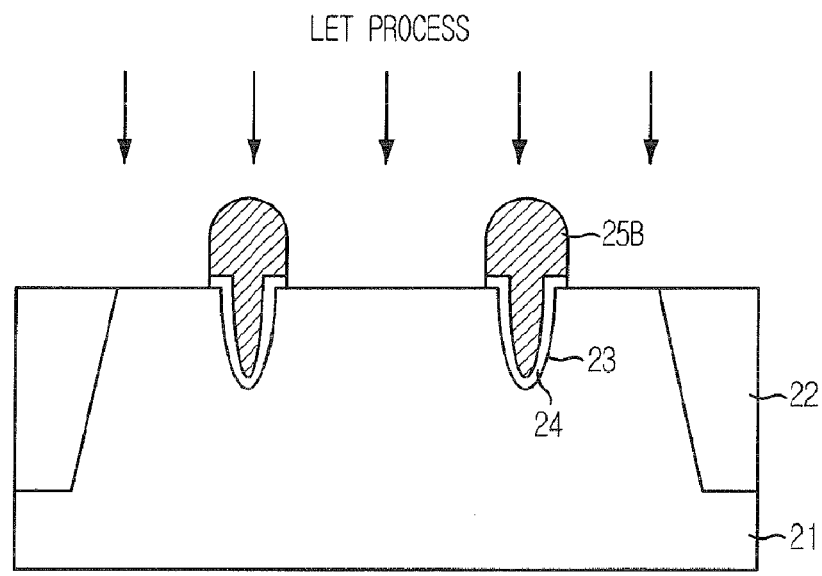

Referring to FIG. 4C, a light etch treatment (LET) is performed to form a rounded conductive pattern 25B of which top corners are somewhat rounded. The LET is performed using an isotropic etch process using $CF_4/O_2$ gas.

Figure 4D:
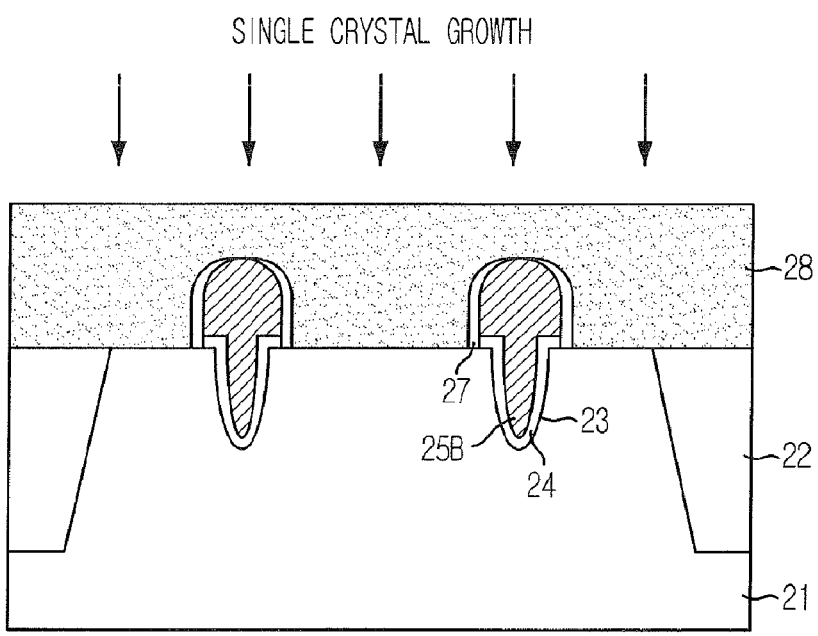

Referring to FIG. 4D, a second gate insulating layer 27 is formed on side surfaces of the rounded conductive pattern 25B. More specifically, an oxide layer is formed on the resultant structure and it is then anisotropically etched to form the second gate insulating layer 27 on the side surfaces of the rounded conductive pattern 25B in the shape of a spacer.

Afterward, an epitaxial semiconductor layer 28 formed of, e.g., silicon, is formed using an epitaxial growth process such that it covers the resultant structure where the rounded conductive pattern 25B is formed. Afterwards, the rounded conductive pattern 25B is embedded within the semiconductor substrate 21 and the epitaxial semiconductor layer 28. As a result, it is possible to secure a channel required for a highly integrated device.

Figure 4E:
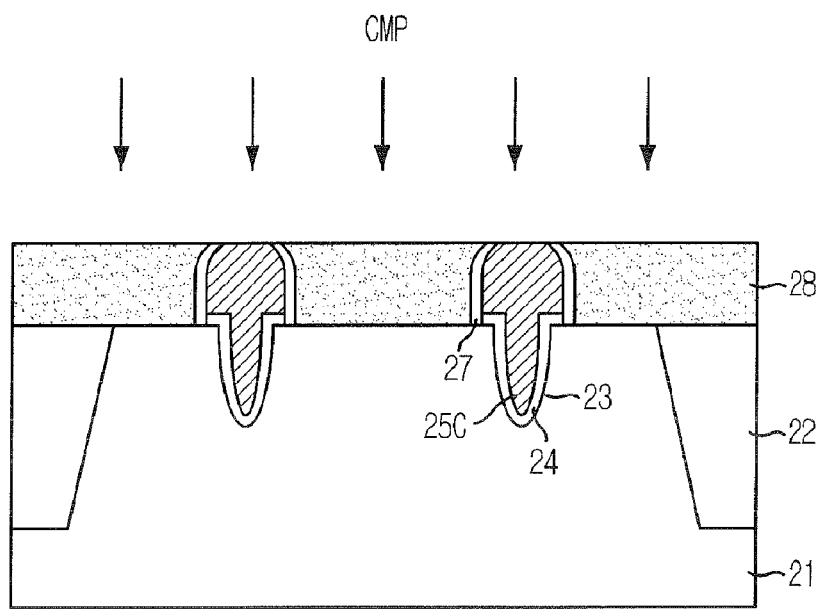

Referring to FIG. 4E, a planarization process such as a chemical mechanical polishing (CMP) or the like is performed so as to expose the top surface of the rounded conductive pattern 25B. During the planarization process, the rounded conductive pattern 25B is also etched partially so that the top surface becomes more rounded to thereby form a gate electrode conductive pattern 25C. For instance, the CMP process is performed for at least approximately 3 seconds or longer so that the epitaxial semiconductor layer 28 may be polished by a thickness of approximately 20 Å or greater.

Figure 4F:
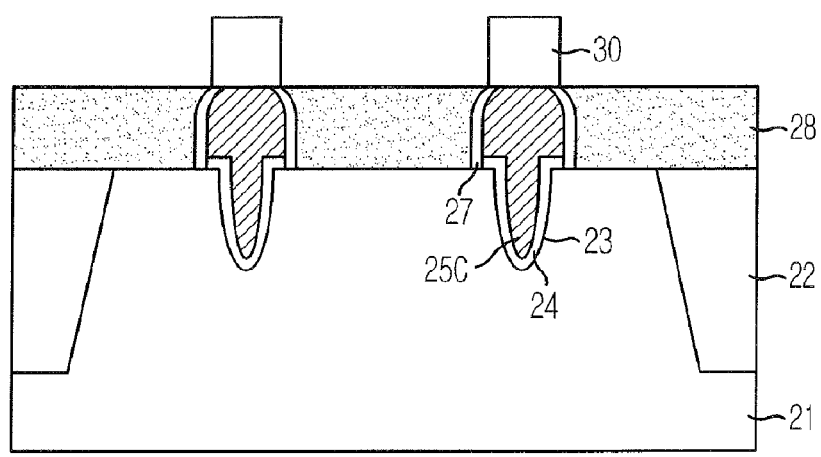

Referring to FIG. 4F, a conductive layer 30 such as a metal layer or a metal silicide layer may be formed on the gate electrode conductive pattern 25C. For example, the conductive layer 30 may include a tungsten layer or a tungsten silicide layer. In some embodiments, the conductive layer 30 may be omitted according to circumstances. The final line width of the recess gate may be at least approximately 35 nm.

In some embodiments, the recess gate structure has a shallow recess so that defects such as seams will not form while depositing the conductive layer in the recess for the gate electrode. Further, despite the shallow recess, the use of the epitaxial semiconductor layer provides a sufficient channel length which is required for a highly integrated device Further, it is possible to prevent the gate electrode conductive pattern from having sharp edges.

While the present invention has been described with respect to the some embodiments, it will be apparent to those skilled in the art that various changes and modifications may be made without departing from the spirit and scope of the invention as defined in the following claims.

The invention claimed is:

1. A semiconductor device having a recess gate, comprising:
   a semiconductor substrate having a recess;
   a polysilicon gate pattern filled into the recess, and having an extension portion protruding higher than a surface of the semiconductor substrate;
   an epitaxial semiconductor layer disposed over the semiconductor substrate and having a top surface as high as a top surface of the polysilicon gate pattern; and
   a gate insulating layer disposed between the epitaxial semiconductor layer and the extension portion of the polysilicon gate pattern, and between the semiconductor substrate and the polysilicon gate pattern.

2. The semiconductor device of claim 1, wherein the semiconductor substrate and the epitaxial semiconductor layer comprise silicon.

3. The semiconductor device of claim 1, wherein the recess is shallow so that the polysilicon gate pattern can be formed in a single step to avoid forming a seam in the polysilicon gate pattern.

4. The semiconductor device of claim 1, wherein the thickness of the epitaxial semiconductor layer is at least approximately 100 Å.

5. The semiconductor device of claim 1, further comprising a gate electrode over the polysilicon gate pattern, wherein the gate electrode comprises at least one of a metal pattern and a metal silicide pattern.

6. The semiconductor device of claim 1, further comprising a gate electrode over the polysilicon gate pattern, wherein the gate electrode comprises at least one of a tungsten pattern and a tungsten silicide pattern.

7. The semiconductor device of claim 1, wherein the gate insulating layer further comprises:

a first oxide layer disposed between the semiconductor substrate and the polysilicon gate pattern; and a second oxide layer disposed between the epitaxial semiconductor layer and the extension portion of the polysilicon gate pattern.

* * * * *